(12) United States Patent
Choi

(10) Patent No.: US 6,233,717 B1
(45) Date of Patent: May 15, 2001

(54) MULTI-BIT MEMORY DEVICE HAVING ERROR CHECK AND CORRECTION CIRCUIT AND METHOD FOR CHECKING AND CORRECTING DATA ERRORS THEREIN

(75) Inventor: Byeng-Sun Choi, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/216,198

(22) Filed: Dec. 18, 1998

(30) Foreign Application Priority Data

Dec. 31, 1997 (KR) ................................. 97-81002

(51) Int. Cl.[7] ................................. G11C 29/00
(52) U.S. Cl. .................. 714/805; 714/764; 365/185.03
(58) Field of Search .................. 714/805, 763–766; 365/185.09, 189.01, 168, 230.01, 200, 225.7, 185.03; 711/103

(56) References Cited

U.S. PATENT DOCUMENTS

| | | | |
|---|---|---|---|
| 4,661,955 | * 4/1987 | Arlington et al. | 714/6 |
| 4,903,268 | 2/1990 | Hidaka et al. | 714/766 |
| 4,958,352 | * 9/1990 | Noguchi et al. | 714/763 |
| 5,262,984 | 11/1993 | Noguchi et al. | 365/185 |
| 5,313,425 | 5/1994 | Lee et al. | 365/201 |
| 5,448,578 | 9/1995 | Kim | 714/766 |
| 5,457,650 | 10/1995 | Sugiura et al. | 365/184 |
| 5,541,886 | 7/1996 | Hasbun | 365/230.01 |
| 5,740,104 | 4/1998 | Forbes | 365/185.03 |
| 5,765,185 | * 6/1998 | Lambrache et al. | 711/103 |
| 5,768,188 | 6/1998 | Park et al. | 365/185.03 |
| 5,768,191 | 6/1998 | Choi et al. | 365/185.22 |
| 6,014,327 | * 1/2000 | Banks | 365/185.03 |

OTHER PUBLICATIONS

Tatsunori et al. (A 4–level storage Gb DRAM. IEEE, Feb. 1997).*

* cited by examiner

*Primary Examiner*—Emmanuel L. Moise
*Assistant Examiner*—Guy Lamarre
(74) *Attorney, Agent, or Firm*—Myers Bigel Sibley & Sajovec

(57) ABSTRACT

An integrated circuit multi-bit memory device incorporating an error check and correction (ECC) technique is provided. In the error correction, two or more groups of parity bits corresponding to a data word of the multi-bit memory device are programmed therein. The groups are classified by the number of bits per cell. Error bits in a memory data word are checked sequentially by the group, and the checked error bits are also corrected sequentially by the group, thereby preventing the device failure due to two or more errors in a data word of the multi-bit memory device.

16 Claims, 6 Drawing Sheets

MULTI-BIT MEMORY DEVICE HAVING ERROR CHECK AND CORRECTION CIRCUIT AND METHOD FOR CHECKING AND CORRECTING DATA ERRORS THEREIN

FIELD OF THE INVENTION

The present invention relates to integrated circuit memory devices and, more particularly, to multi-bit memory devices with error check and correction (ECC) capability, whose one memory cell stores more than two possible data states.

The present invention further relates to ECC methods for integrated circuit memory devices and, more particularly, to methods of checking data errors and correcting them in the multi-bit memory devices, such as multi-bit mask ROMs (Read-Only Memories), or multi-bit EEPROMs (electrically erasable and programmable ROMs), whose one memory cell stores more than two possible data states.

The present invention is based on Korean Patent Application Serial No. 81002/1997 which is incorporated herein by reference for all purpose.

BACKGROUND OF THE INVENTION

In digital electronic systems, information is represented in binary format (1's and 0's). When binary information is passed from one point to another, there is always some chance that a mistake can be made; a 1 interpreted as a 0 or a 0 taken to be a 1. This can be caused by media defects, component failures, electronic noise, poor connections, deterioration due to age, and other factors. When a bit is mistakenly interpreted, a bit error has occurred.

In the field of integrated circuit semiconductor memory devices, redundancy is used primarily for fixing bit-line and word-line failures (i.e., for correcting "hard errors") in the devices to improve the production yield. If however redundancy is used, then the entire memory array may be increased.

A method of having essentially the same yield improvement while occupying less. area on a memory chip is to use an ECC technique. Error correction is useful in memory systems not only to correct "soft errors" due to noise or alpha particle hits, but also for the hard error correction. Error correction involves two steps. One is detecting the error and the other is correcting it. With such an error correction, it is possible to improve the reliability of the memory devices as well as yield.

More specifically, Hamming codes, which were first developed by Hamming in 1950, are frequently used for this purpose. With a Hamming code, error correction can be performed on many different bit field sizes. This entails using additional parity bits in the array. To determine the number of parity bits needed to correct a given number of data bits such as 8, 16, 32, 64, 128 bits, the following inequality must be satisfied $$2^k \geq m+k+1 \qquad (1)$$

where 'm' is the number of data bits to be corrected and 'k' is the number of parity bits needed for correction. For example, if the number (m) of data bits is 8, the number (k) of parity bits is 4, and if the number (m) of data bits is 64, the number (k) of parity bits is 7.

There is a trade-off in that small bit fields allow fast error detection but require a large number of extra parity bits in the memory matrix. Large bit fields permit use of a smaller amount of extra matrix for the parity cells but error detection is slower.

Another type of error correction code which has been used on memories is the 'horizontal-vertical (H-V)' error correction technique was developed by Edwards in 1981 and proposed for DRAMs by Burroughs. This method is also called bidirectional error correction.

In this method the memory is divided into blocks of a fixed size. To each byte, a horizontal parity bit is added. A vertical parity also generated and stored. During normal operation only the horizontal parity is checked which improves the time delay due to the error correction. If an error is detected when the horizontal parity bit is checked then the vertical parity bit is checked. The error is then found at the intersection of the two parities.

With above-described single error correction, a data word (e.g., 8, 16, 32, 64, 128 bits, etc.) with one bad bit can be corrected to recover the original information, whereas two bad bits can be detected, but not corrected.

Contemporary ECC techniques are disclosed, for example, in U.S. Pat. No. 4,903,268 for Semiconductor Memory Device Having On-Chip Error Check And Correction Functions issued to Hidaka et al., U.S. Pat. No. 4,958, 352 for Semiconductor Memory Device With Error Check And Correcting Function issued to Noguchi et al., U.S. Pat. No. 5,313,425 for Semiconductor Memory Device Having An Improved Error Correction Capability issued to Lee et al., U.S. Pat. No. 5,448,578 for Electrically Erasable And Programmable Read Only Memory With An Error Check And Correction Circuit issued to Kim, and U.S. Pat. No. 5,765,185 for EEPROM Array With Flash-Like Core Having ECC Or A Write Cache Or Interruptible Load Cycles issued to Lambrache et al., all of whose disclosures are incorporated herein by reference.

Meanwhile, as semiconductor memory devices continue to increase in density and grow in area, neither redundancy nor error correction alone may be sufficient to give acceptable yield. Therefore, it is desirable to use the two methods effectively in combination to give improvement in long term in-system yield.

Desires toward efficient integration density for more expanded memory capacity have led to the development of multi-bit (or multi-level, or multi-state) technology by which a plurality of data bits are stored in one memory cell. Examples of contemporary multi-bit memory devices are disclosed in U.S. Pat. No. 5,262,984 for Non-Volatile Memory Device Capable Of Storing Multi-State Data issued to Noguchi et al, U.S. Pat. No. 5,457,650 for Apparatus And Method For Reading Multi-Level Data Stored In A Semiconductor Memory issued to Sugiura et al., U.S. Pat. No. 5,541,886 for Method And Apparatus For Storing Control Information In Multi-Bit Non-Volatile Memory Arrays issued to Hasbun, U.S. Pat. No. 5,740,104 for Multi-State Flash Memory Cell And Method For Programming Single Electron Differences issued to Forbes, U.S. Pat. No. 5,768, 188 for Multi-State Non-Volatile Semiconductor Memory And Method For Driving The Same issued to Park et al., and U.S. Pat. No. 5,768,191 for Methods Of Programming Multi-State Integrated Circuit Memory Devices issued to Choi et al., whose disclosures are herein incorporated by reference.

In such ROM devices, a memory cell can be programmed to have one of four (4) data states of two bits, i.e., "11", "10", "01" and "00". Thus, a ROM cell can be programmed to be a two-bit device instead of just a one-bit device which advantageously doubles the amount of information that a memory device may contain, and so contributes to reduction of the cost per bit.

Considering small margin between threshold voltages corresponding to data states of low-voltage, high-density multi-bit memory devices, the adoption of ECC against bit fail is essential in improving the reliability of the memory devices as well as yield.

In general, there is a higher possibility that both of the two bits stored in such a multibit memory cell are susceptible to the soft and hard errors. If there occur two bit errors on a multibit cell, for example, when data "00" has changed into "11", or vice versa, then it is impossible to correct them using the conventional ECC techniques since only one bit error in a predetermined data word (e.g., 32, 64, or 128 bits) can be corrected by the techniques, so the accuracy of the error correction will be guaranteed.

SUMMARY OF THE INVENTION

Accordingly, an object of the present invention is to provide multibit semiconductor memory devices with ECC circuitry to ensure the accuracy and integrity of data.

It is another object of the present invention to provide multibit memory devices capable of correcting more than one bit error in a data word, thus preventing the device failure due to two or more errors in the same word.

It is still another object of the present invention to provide methods checking two or more errors and correcting them in a data word of multibit semiconductor memory devices without error correction fail.

These and other objects, advantages and features of the present invention are provided by storing normal data information into a plurality of first memory cells (i.e., multibit memory cells) each storing more than two possible data states, wherein each data state is represented by two or more data bits and the respective data bits are classified into two or more groups (or sets), and by storing two or more groups of parity bits corresponding to the two or more groups of the data bits respectively into a plurality of second memory cells (single bit memory cells or multibit memory cells). The memory devices include a plurality of sense amplifiers for sensing the two or more groups of the data bits and a plurality of data latches for latching the two or more groups of the sensed data bits, respectively. Each of the sense amplifiers corresponds to at least two of the data latches depending upon bits per cell, and the plurality of the data latches are classified into two or more groups each including only one of the at least two data latches corresponding to each sense amplifier. In particular, the memory devices include an ECC circuit which checks error bits out of the latched data bits sequentially by the group and corrects the checked error bits sequentially by the group.

According to another aspect of the present invention, an error correction method for multibit memory devices is provided. Normal data information is stored into a plurality of first memory cells each storing more than two possible data. Each data state is represented by two or more data bits and the respective data bits are classified into two or more sets. Then, two or more sets of parity bits corresponding to the two or more sets of the data bits respectively are stored into a plurality of second memory cells. Alternatively, the second step can be followed by the first step. Thereafter, the two or more sets of the data bits are sensed and latched. Error bits out of the two or more sets of the latched data bits are checked set by set. Finally, the checked error bits are corrected set by set.

As is apparent from the foregoing, according to the ECC circuit and method of the invention, it is possible to correct more than one bit error in a data word of multibit memory devices and provide improved reliability and increased yield thereof.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

In describing a preferred embodiment of the present invention, reference is made to accompanying drawings wherein.

DETAILED DESCRIPTION OF THE PREFERRED EMBODIMENT

It is one of the most important features that an integrated circuit multibit memory device of the invention incorporates a novel error check and correction (ECC) technique. According to this error correction method, two or more groups of parity bits corresponding to a data word (e.g., 128 bits) of the multibit memory device are programmed therein. The groups are classified by the number of bits per cell (e.g., 2 bits). Error bits in a memory data word are checked sequentially by the group, and the checked error bits are also corrected sequentially by the group, which makes it possible to prevent the device failure due to two or more errors in a data word of the multibit memory device.

Throughout the following description, specific details are set forth in order to provide a more thorough understanding of the present invention. It will be apparent, however, to one skilled in the art that the present invention may be practiced without these specific details.

A preferred embodiment of the invention will be described with reference to the accompanying drawings, in which well known circuits are shown in block diagram form or have not been shown to avoid unnecessarily obscuring the present invention. Herein, the embodiment of the invention will be discussed with reference to a multibit mask ROM environment, for the sake of simplicity. It is noted, however, that any other multibit semiconductor memory devices, such as multibit EEPROMs and the like can be used to implement the inventive concept of the presently disclosed embodiment. In addition, the memory device of this embodiment is implemented with error correction circuitry based on Hamming codes, but other error correction codes can be used therefor.

Figure 1:
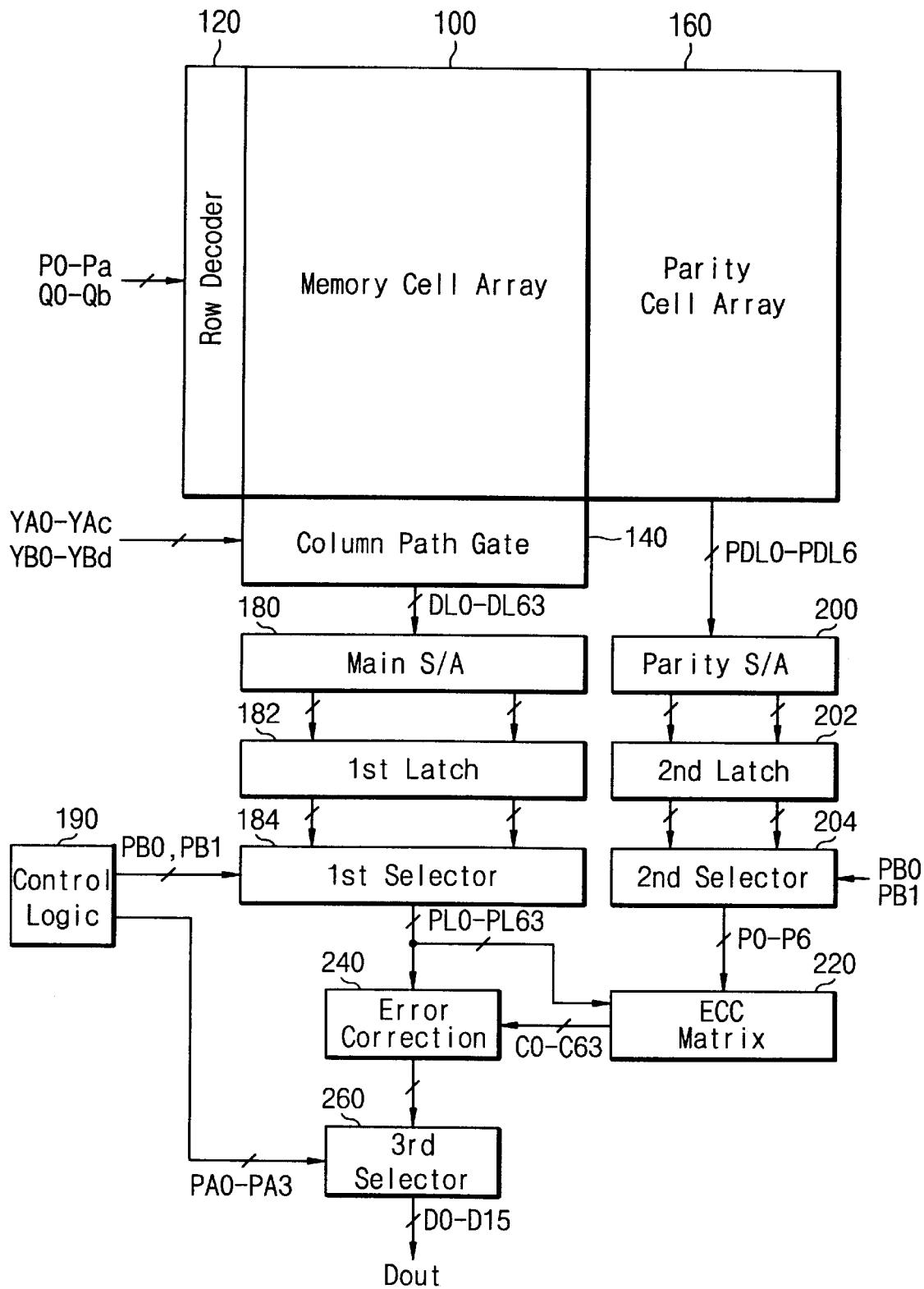
FIG. 1 is a block diagram illustrating a preferred embodiment of a multibit memory device according to the present invention.

Now, reference is made to FIG. 1, which illustrates a preferred embodiment of a multibit memory device implemented with ECC circuitry using Hamming codes for error correction, in accordance with the present invention. The multibit memory device of this embodiment is assumed to be a 256 Mb device. An array 100 of multi-bit memory cells of 256 Mb (e.g., 8 Kb×16 Kb) is provide for storing normal data bits. In actual configuration, however, the memory cell array 100 has the size of 128 Mb since each cell therein is programmed to have one of four possible data states of two bits (i.e, "00", "01", "10", and "11"). Here, even though this embodiment is explained through the two-bit memory cells having four possible data states, for simplicity, it should be noted, however, that the present invention is applicable to the memory cells having more than four possible states.

A row decoder 120 and a column pass gate (usually called "column decoder") 140 are disposed in the vicinity of the memory cell array 100. The row decoder 120 selects one row of the memory cell array 100 in response to row predecoding signals P0–Pa and Q0–Qb from a row predecoder (not shown), where a and b are positive integers. The column path gate 140 selects sixty four (64) columns of the memory cell array 100 in response to column predecoding signals YA0–YAc and YB0–YBd from a column predecoder (not shown), where c and d are positive integers.

A main sense amplifier circuit 180 is electrically coupled with the column pass gate circuit through main data lines DL0–DL63. The main sens amplifier circuit 180 senses and amplifies a data word of 128 bits stored in the selected sixty four multibit cells within the memory cell array 100, at a time. The sensed 128 bits data are classified into two 64-bit groups and both are latched into a data latch circuit 182. A selector circuit 184 selectively outputs the two data groups by turns in response to select control signals PB0 and PB1.

Figure 2:
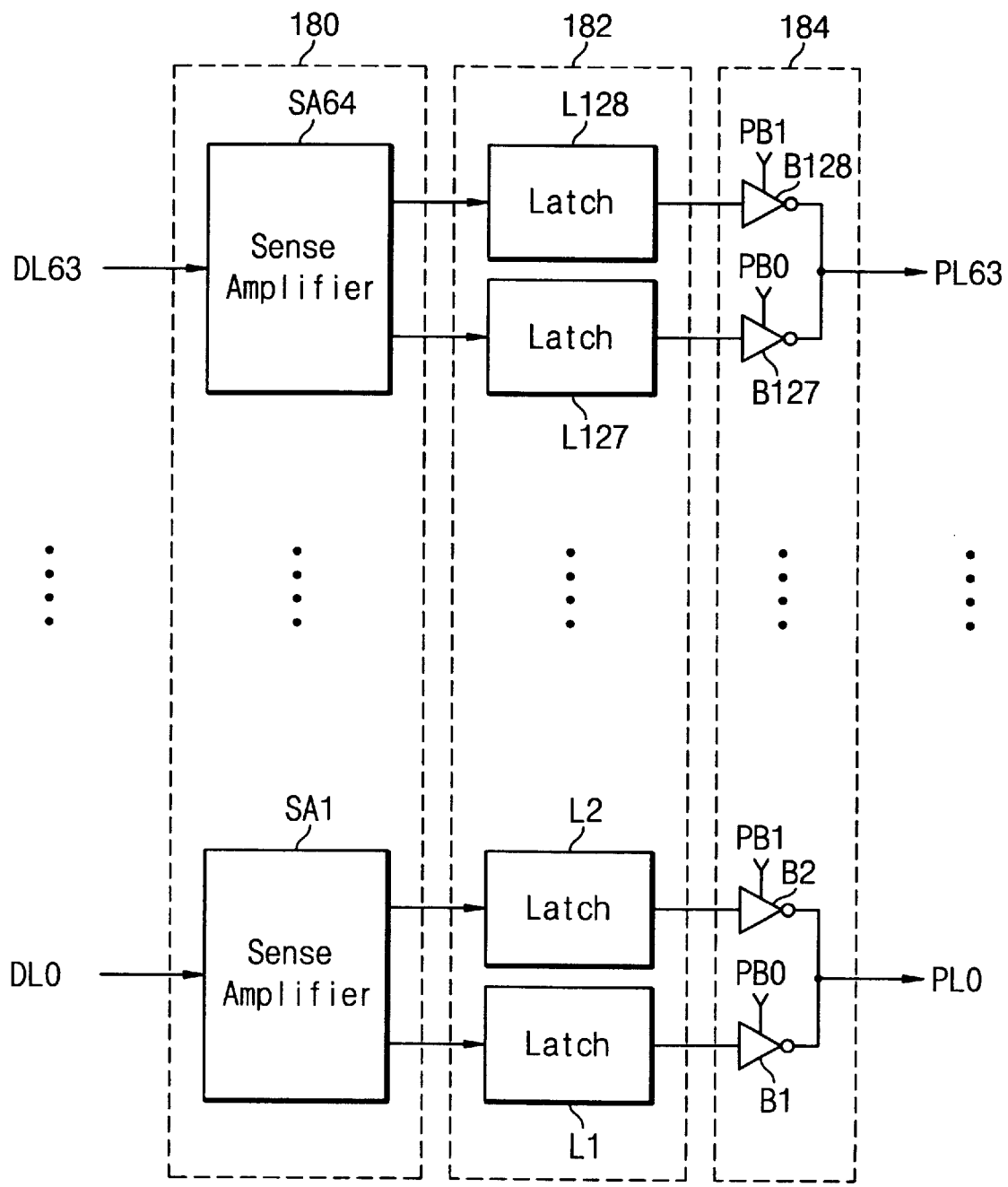
FIG. 2 is a circuit diagram illustrating the configurations of the main sense amplifier circuit and its associated latch and selector circuits shown in FIG. 1 in detail.

FIG. 2 illustrates more detailed configurations of main sense amplifier circuit 180, latch circuit 182 and selector circuit 184. As illustrated, the main sense amplifier circuit 180 includes 64 sense amplifiers SA1–SA64 corresponding to the respective data line DL0–DL63. An individual sense amplifier (e.g., SA1) senses 2-bit data via a single data line (e.g., DL0). The data latch circuit 182 consists of 128 latch elements L1–L128. A pair of latch elements (e.g., L1 and L2) correspond to each sense amplifier (e.g., SA1) and latch two data bits from the corresponding sense amplifier. The latch elements L1–L128 are divided into two groups: one group of odd-numbered latch elements L1, L3, . . . , L127 and the other group of even-numbered latch element L2, L4, . . . , L128. Higher order bits of the respective sense amplifiers SA1–SA64 (64 bits) are latched by the 64 odd-numbered latch elements L1, L3, . . . , L127. Lower order bits of the respective sense amplifiers SA1–SA64 are latched by the even-numbered latch elements L2, L4, . . . , L128.

The selector circuit 184 is formed by 128 tri-state buffers B1–B128. This buffers B1–B128 also fall into two groups: one group of odd-numbered buffers B1, B3, . . . , B127 and the other group of even-numbered buffers B2, B4, . . . , B128. The first group of buffers B1, B3, . . . , B127 are coupled between the first group of latch elements L1, L3, L127 and data lines PL0–PL63, respectively. Also, the second group of buffers B2, B4, . . . , B128 are coupled between the second group of latch elements L2, L4, . . . , L128 and the data lines PL0–PL63, respectively. The active high tristate control inputs of the first grouped buffers B1, B3, . . . , B127 are commonly applied with one select control signal PB0 from the control logic 190, whereas those of the second grouped buffers B2, B4, . . . , B128 are applied with the other select control signal PB1 from the control logic 190. When the respective control signals PB0 and PB1 become active, the respective buffers B1–B128 are switched on. On the contrary, when they are inactive, the respective buffers B1–B128 are off. The control logic 190 activates the tristate control signals PB0 and PB1 by turns during a data sensing period.

In the event a memory cell stores more than four possible states, more than two latch elements and tristate buffers will correspond to each sense amplifier, as will be understood by one having skill in the art. In this case, each group has only one among the two or more latch elements corresponding to each sense amplifier. In addition, if either odd-numbered buffers or even-numbered buffers are replaced with the tristate buffers having active low control inputs, the alternative selection of data bits can be performed by only one of the control signals PB0 and PB1.

Referring again to FIG. 1, the memory device has another array 160 of multibit memory cells. This cell array 160 is used to store parity bits corresponding to the data bits stored in the memory cell array 100. In this embodiment, Hamming codes are used for error correction and the error correction is assumed to performed by the data word of 64 bits, so it is clear that seven (7) parity bits per data word (i.e., 64 bits) are necessary, from the equation (1). The parity cell array 160 has memory capacity of 28 Mb, but its actual size is 14 Mb because each cell therein is programmed to have one of four possible data states of two bits. When a data word of 128 bits (i.e., two 64-bit data groups) is written into the main memory cell array 100, a parity word of 14 bits (i.e., two 7-bit parity groups) corresponding to the respective two 64-bit data groups are programmed into the parity cell array 160. Higher oder bits of the respective seven 2-bit parity data (or 7 parity cells) are programmed with respect to higher order bits of the respective sixty-four 2-bit data (or 64 memory cells), and lower oder bits of the respective seven parity cells are programmed with respect to lower oder bits of the respective sixty-four memory cells. Alternatively, lower oder bits of the respective seven parity cells can be programmed with respect to higher order bits of the respective sixty-four memory cells, and higher oder bits of the respective seven parity cells can be programmed with respect to lower oder bits of the respective sixty-four memory cells.

Rows of the parity cell array 160 are also selected by the row decoder 120 responsive to the row predecoding signals P0–Pa and Q0–Qb. Here, it can be appreciated that the multibit parity cell array 160 is replaced with a single bit cell array whose one cell having two possible data states.

A parity sense amplifier circuit 200 is electrically coupled to seven (7) columns of the parity cell array 160 via parity data lines PDL0–PDL6. The parity sense amplifier circuit 200 is provided to sense and amplify fourteen (14) parity bits corresponding to a 128-bit data word at a time. The sensed fourteen parity bits fall into two 7-bit groups and both are also latched by a parity latch circuit 202. A selector circuit 204 selectively outputs the two parity groups by turns in response to select control signals PB0 and PB1.

Figure 3:
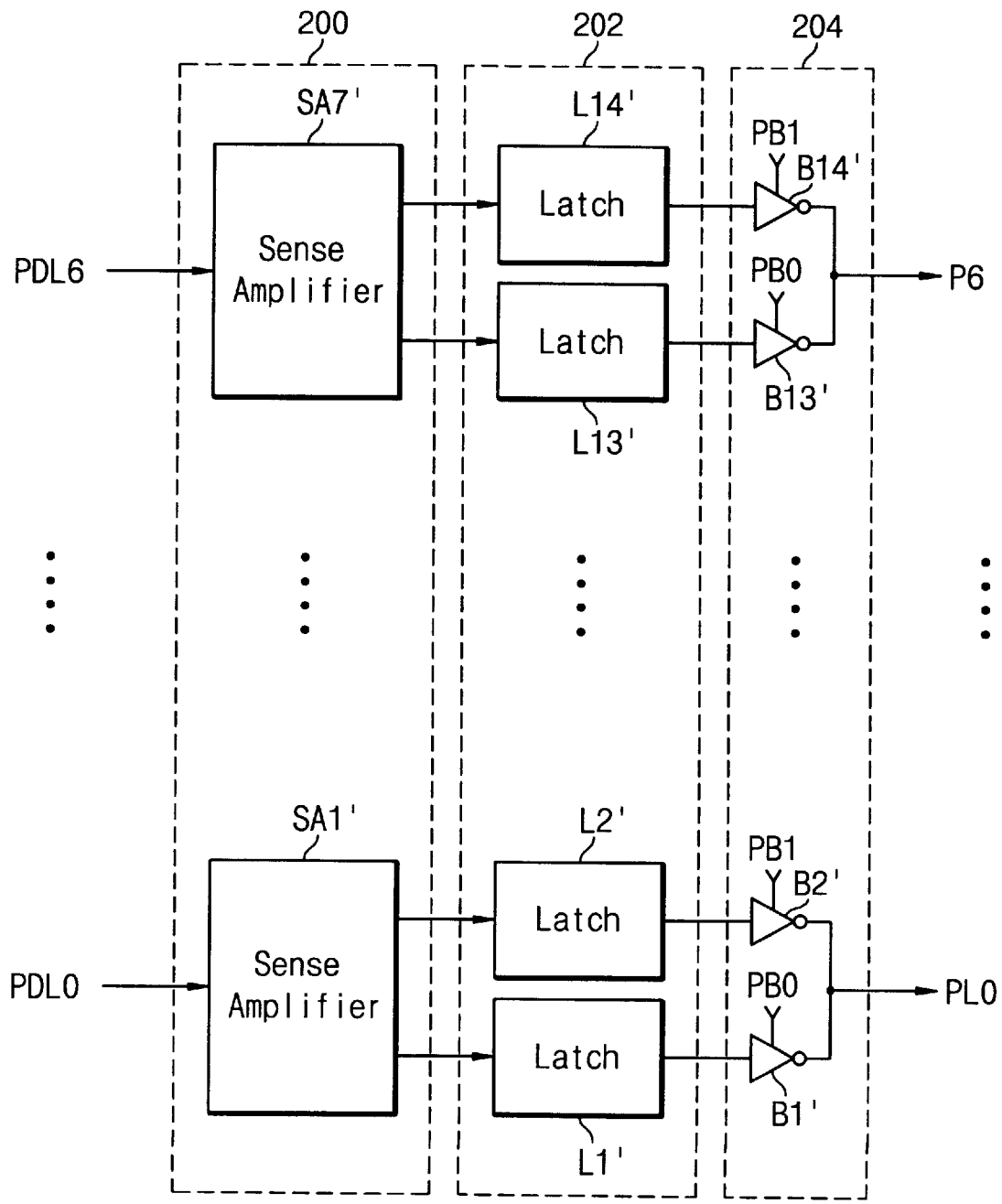
FIG. 3 is a circuit diagram illustrating the configurations of the parity sense amplifier circuit and its associated latch and selector circuits shown in FIG. 1 in detail.

Referring to FIG. 3, more detailed configurations of parity sense amplifier circuit 200, its associated latch and selector circuits 202 and 204 are shown. The parity sense amplifier circuit 200 includes 7 sense amplifiers SA1'–SA7' corresponding to the respective data line PDL0–PDL6. An individual sense amplifier senses 2-bit data via a single data line. The data latch circuit 202 consists of 14 latch elements L1'–L14'. A pair of latch elements (e.g., L1' and L2') correspond to each sense amplifier (e.g., SA1') and latch two data bits from the corresponding sense amplifier. The latch elements L1'–L14'are divided into two groups: one group of odd-numbered latch elements L1', L3', . . . , L13'and the other group of even-numbered latch element L2', L4', . . . , L14'. Higher order bits of the respective sense amplifiers SA1'–SA7' (7 bits) are latched by the odd-numbered latch elements L1', L3', . . . , L13'. Lower order bits of the respective sense amplifiers SA1'–SA7' are latched by the even-numbered latch elements L2', L4', . . . , L14'.

The selector circuit 204 is formed by 14 tri-state buffers B1'–B14'. This buffers B1'–B14' are also classified into two groups: one group of odd-numbered buffers B1', B3', . . . , B13' and the other group of even-numbered buffers B2', B4', . . . , B14'. The odd-numbered buffers B1', B3', . . . , B13' are coupled between the first group of latch elements L1', L3', . . . , L13' and data lines P0–P6, respectively. Also, the even-numbered buffers B2', B4', . . . , B14' are coupled between the second group of latch elements L2', L4', . . . , L14' and the data lines P0–P6, respectively. The active high tristate control inputs of the first grouped buffers B1', B3', . . . , B13' are commonly applied with one select control signal PB0 from the control logic 190 and those of the second grouped buffers B2', B4', . . . , B14' with the other select control signal PB1 therefrom. When the respective control signals PB0 and PB1 become active, the respective buffers B1'–B14' are switched on. On the contrary, when they are inactive, the respective buffers B1'–B14' are off. The control logic 190 activates the tristate control signals PB0 and PB1 by turns during a data sensing period. The control circuit 190 includes an internal address generator (not shown) to generate a series of internal column address signals in response to an external column address signal. One or more of the internal column address signals may be used as the latch select signals PB0 and PB1, as will be understood by one having skill in the art.

As described before, if a memory cell stores more than four possible states, more than two parity latch elements and tristate buffers will correspond to each parity sense amplifier, as will be understood by one having skill in the art. In this case, each group has only one among the two or more latch elements corresponding to each parity sense amplifier. In addition, if either odd-numbered buffers or even-numbered buffers are replaced with the tristate buffers having active low control inputs, the alternative selection of data bits can be performed by only one of the control signals PB0 and PB1.

Figure 4:
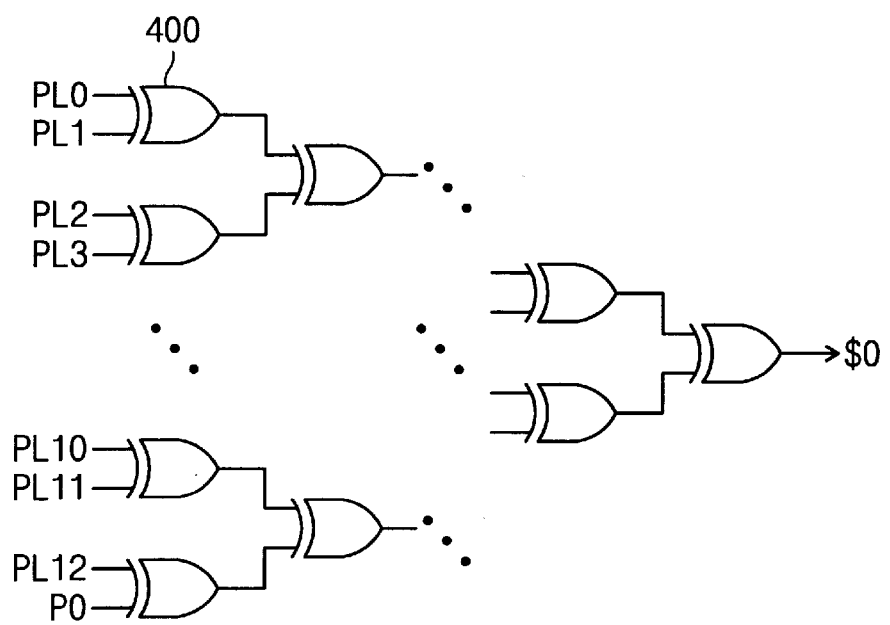
FIG. 4 is a detailed circuit diagram of a portion of the ECC matrix circuit of FIG. 1.
Figure 4:
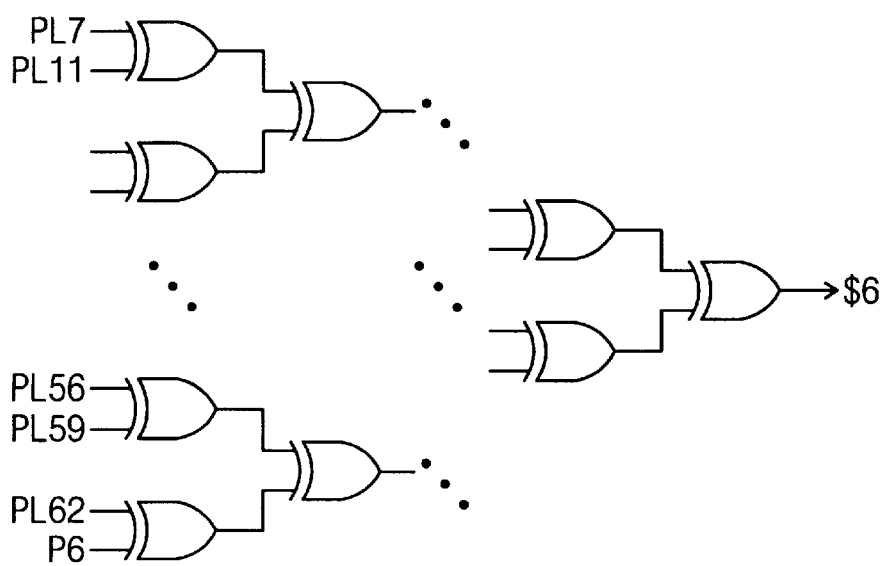
Figure 5:
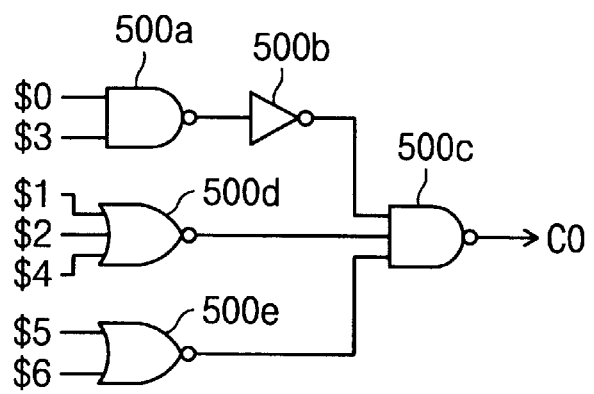
FIG. 5 is a detailed circuit diagram of the other portion of the ECC matrix circuit of FIG. 1.
Figure 5:
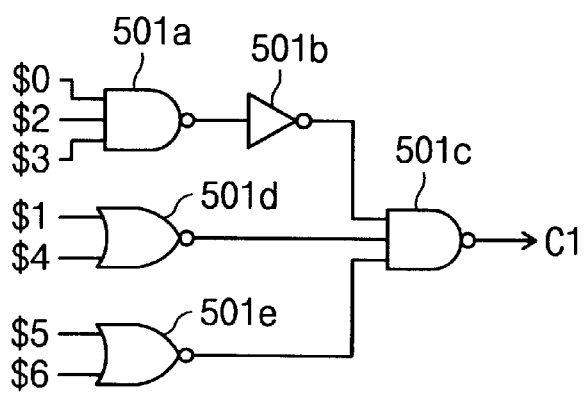
Figure 5:
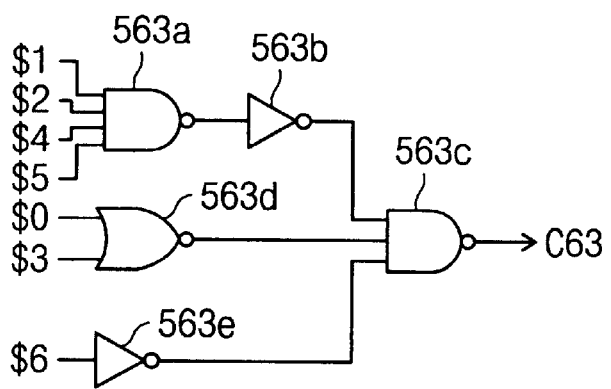

Turning back to FIG. 1, the 7-bit outputs of the selector circuit 204 are provided to an ECC matrix circuit 220. Although not shown in FIG. 1, the ECC matrix circuit 220 consists of a syndrome generator and a syndrome decoder, which are illustrated in FIGS. 4 and 5, respectively. The syndrome generator includes a plurality of exclusive OR gates 400, as shown in FIG. 4, and the syndrome decoder are formed by NAND gates 500a–563a and 500c–563c, inverters 500b–563b and 563e, and NOR gates 500d–563d and 500e–562e, as shown in FIG. 5. The syndrome generator and the syndrome decoder are constructed depending on the following exemplary 64-bit Error Correction Coding Matrix Tables 1 and 2.

TABLE 2

|    | P0 | P1 | P2 | P3 | P4 | P5 | P6 |
|----|----|----|----|----|----|----|----|
| $0 | o  |    |    |    |    |    |    |
| $1 |    | o  |    |    |    |    |    |
| $2 |    |    | o  |    |    |    |    |
| $3 |    |    |    | o  |    |    |    |
| $4 |    |    |    |    | o  |    |    |
| $5 |    |    |    |    |    | o  |    |
| $6 |    |    |    |    |    |    | o  |

In the above Table 1, the Arabic numerals 0–63 on row represent data bits PL0–PL63, respectively, and symbols $0–$6 represent syndrome signals. In the Table 2, symbols P0–P6 represent parity bits.

The syndrome generator of FIG. 4 performs an Exclusive-OR operation of the outputs PL0–PL63 (data bits) and P0–P6 (parity bits) of the selector circuits 184 and 204, and generates syndrome signals $0–$6. This signals $0–$6 are applied to the syndrome decoder of FIG. 5. The syndrome decoder of FIG. 5 decodes the syndrome signals $0–$6 and outputs syndrome decoding data C0–C63.

With continuing reference to FIG. 1, the syndrome decoding data bits C0–C63 are applied to error correction circuit 240 together with the memory data bits PL0–PL63 from the select circuit 184. The error correction circuit 240 compares the syndrome decoding data bits C0–C63 with the memory data bits PL0–PL63, respectively. When any one arbitrary memory data bit is found to be in error, this bit is corrected by the syndrome decoding data bits. The corrected memory data of 64 bits are provided to a selector circuit 260. This circuit 260 selects 16 bits from the corrected data of 64 bits in response to control signals PA0–PA3 from the control logic circuit 190 and transfers them to the 16-bit data bus D0–D15, successively.

Figure 6:
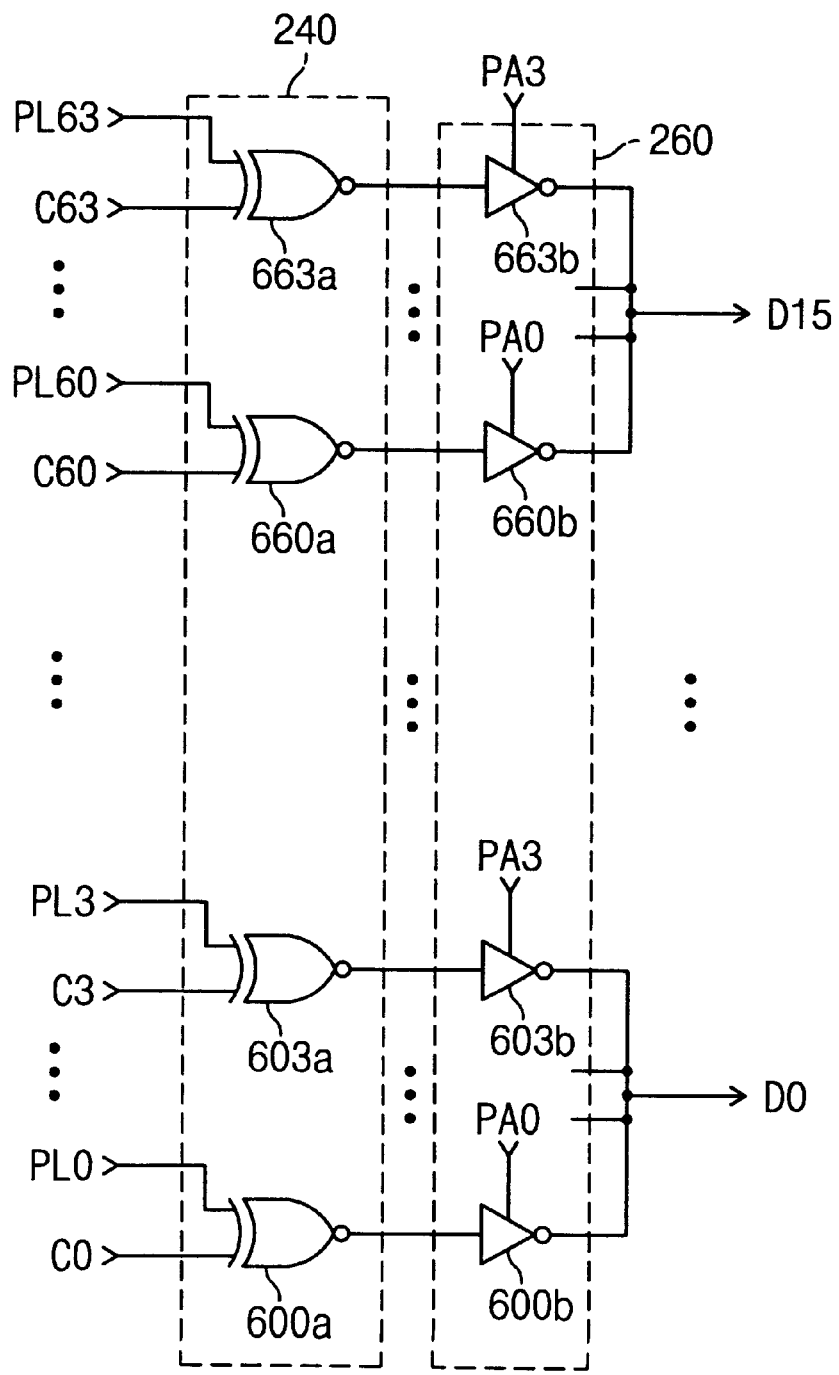
FIG. 6 is a detailed circuit diagram of the error correction circuit and its associated selector circuit shown in FIG. 1.

In FIG. 6, constructions of the error correction circuit 240 and the selector circuit 260 are shown. Referring to FIG. 6, the error correction circuit 240 is constructed with sixty four exclusive NOR gates 600a–663a. Each exclusive NOR gates has one input for receiving a corresponding data bit PLi and another input for receiving a corresponding syndrome decoding bits Ci, where i=0, 1, . . . , 63. The selector circuit 260 is comprised of sixty four tristate buffers 600b–663b. The buffers 600b–663b correspond to the exclusive NOR gates 600a–663a, respectively. Four exclusive NOR gates (e.g., 600a–603a) and four tristate buffers (e.g., 600b–603b) form a unit cell. So, there exist 16 unit cells which correspond to the 16 data bus lines D0–D15, respectively. Four buffers in a unit cell (e.g., 600b–603b) are coupled between corresponding exclusive NOR gates (e.g., 600a–663a) and a corresponding data bus line (e.g., D0). Tristate control inputs of the four buffers within each cell are

TABLE 1

|    | 0 | 1 | 2 | 3 | 4 | 5 | 6 | 7 | 8 | 9 | 10 | — | 57 | 58 | 59 | 60 | 61 | 62 | 63 |
|----|---|---|---|---|---|---|---|---|---|---|----|---|----|----|----|----|----|----|----|
| $0 | o | o | o | o | o |   |   |   |   | o | —  |   |    |    |    |    |    |    |    |
| $1 |   | o | o | o | o | o | o | o | o |   | —  |   | o  | o  | o  | o  | o  | o  | o  |
| $2 |   | o |   | o | o | o | o | o | o |   | —  |   | o  | o  | o  | o  | o  | o  | o  |
| $3 | o | o | o |   | o | o | o | o | o | o | —  |   |    |    |    |    |    |    |    |
| $4 |   |   |   |   |   |   |   |   |   | o | —  |   |    |    |    | o  | o  | o  | o  |
| $5 |   |   |   |   |   |   |   | o |   |   | —  |   | o  | o  | o  |    |    |    | o  |
| $6 |   |   |   |   |   |   | o |   |   |   | —  |   |    | o  |    | o  |    |    |    | applied with the control signals PA0–PA3, respectively. When the respective control signals PA0–PA3 become active, the respective buffers 600b–663b are switched on. On the contrary, when they are inactive, the respective buffers 600b–663b are off. The control logic 190 activates the tristate control signals PA0–PA3 by turns during a data output period.

As described above, according to the ECC circuit and method of the invention, it is possible to correct more than one bit error in a data word of multibit memory devices and provide improved reliability and increased yield thereof.

The invention has been described using an exemplary preferred embodiment. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multi-bit memory device, comprising:

a plurality of memory cells, each of the memory cells operative to take on more than two data states;

a plurality of sense amplifiers, operatively associated with the plurality of memory cells, that sense data states of the plurality of memory cells and generate data bits therefrom;

a plurality of data latches, respective groups of which store data bits generated by respective ones of the plurality of sense amplifiers such that respective ones of the groups of data latches store respective multi-bit values representing respective data states; and means, operatively associated with the plurality of data latches, for checking data bits stored by a first subset of the plurality data latches corresponding to a first bit position of the stored multi-bit values and then checking data bits stored by a second subset of the plurality of data latches corresponding to a second bit position of the stored multi-bit values.

2. The multi-bit memory device according to claim 1, further comprising means, responsive to the means for checking, for correcting the checked data bits.

3. The multi-bit memory device according to claim 1, where the means for checking comprises:

an error detection circuit that receives a plurality of input data bits and generates respective error indication signals for respective ones of the received input data bits;

a selector circuit that, responsive to a select control signal, selectively couples the error detection circuit to the first subset of the plurality of data latches or to the second subset of the plurality of data latches to provide the input data bits.

4. The multi-bit memory device according to claim 3, further comprising an error correction circuit that corrects the stored data bits responsive to the generated error indication signals.

5. The multi-bit memory device according to claim 3:

wherein the plurality of memory cells comprises a first plurality of memory cells;

wherein the multi-bit memory device further comprises a second plurality of memory cells that stores parity information for the first plurality of memory cells; and wherein the error detection circuit is responsive to the second plurality of memory cells to check the received data bits based on the stored parity information.

6. The multi-bit memory device according to claim 5:

wherein the plurality of sense amplifiers comprises a first plurality of sense amplifiers;

wherein the plurality of data latches comprises a first plurality of data latches;

wherein the selector circuit comprises a first selector circuit;

wherein each of the second plurality of memory cells is operative to take on more than two data states;

wherein the error detection circuit is operative to receive the plurality of input data bits and a plurality of input parity bits and to generate respective error indication signals for respective ones of the received input data bits based on the received input parity bits;

wherein the multi-bit memory device further comprises:

a second plurality of sense amplifiers, operatively associated with the second plurality of memory cells, that sense data states of the second plurality memory cells and generate data bits therefrom;

a second plurality of data latches, respective groups of which store data bits generated by respective ones of the second plurality of sense amplifiers such that respective ones of the groups of data latches of the second plurality of data latches store respective multi-bit values representing respective data states; and a second selector circuit that, responsive to the select control signal, selectively couples the error detection circuit to a first subset of the second plurality of data latches or to a second subset of the second plurality of data latches to provide the input parity bits.

7. The multi-bit memory device according to claim 5, wherein the error detection circuit comprises:

a syndrome generator operative to generate syndrome signals from the received input data bits and the parity information; and a syndrome decoder that decodes the generated syndrome signals.

8. A multi-bit memory device, comprising:

a first array of a plurality of first memory cells, for a plurality of data bits, each of the memory cells storing four possible data states;

a plurality of first sense amplifiers for sensing the data bits;

a plurality of first data latches for latching the sensed data bits, respectively;

wherein each of the first sense amplifiers corresponds to a pair of the first data latches, and the plurality of the first data latches are classified into two groups each including only one of each first data latch pair;

a control circuit for generating one or more latch select signals;

a first select circuit for selecting the two groups of the first data latches by turns in response to the one or more latch select signals;

a second array of a plurality of second memory cells, for storing a plurality of parity bits corresponding to the data bits, wherein the second memory cells each stores four possible data states;

a plurality of second sense amplifiers for sensing the parity bits;

a plurality of second data latches for latching the sensed parity bits, respectively, wherein each of the second amplifiers corresponds to a pair of the second data latches, and the plurality of the second data latches are classified into two groups each including only one of each second data latch pair;

a second select circuit for selecting the two groups of the second data latches by turns in response to the one or more latch select signals; and means for checking error bits out of the latched data bits in the selected one group of the first data latches and correcting the checked error bits, in response to the sensed parity bits, wherein the means for checking and correcting error bits operates in response to the parity bits from the selected group of the second data latches.

9. The memory device ac cording to claim 8, wherein higher order ones of the data bits latched by the respective first data latch pairs correspond to higher order ones of the parity bits latched by the respective second data latch pairs, and lower order ones of the data bits latched by the respective first data latch pairs correspond to lower order ones of the parity bits latched by the respective second data latch pairs.

10. The memory device according to claim 8, wherein higher order ones of the data bits latched by the respective first data latch pairs correspond to lower order ones of the parity bits latched by the respective second data latch pairs, and lower order ones of the data bits latched by the respective first data latch pairs correspond to higher order ones of the parity bits latched by the respective second data latch pairs.

11. A method of operating a multi-bit memory device including a plurality of memory cells, each of which is operative to take on more than two data states, the method comprising steps of:

sensing respective data states of respective ones of the plurality of memory cells;

latching respective multi-bit values representing respective ones of the sensed data states;

error checking first bit positions of the latched multi-bit values; and then error checking second bit positions of the latched multi-bit values.

12. The method according to claim 11, further comprising the step of correcting the stored data bits based on results of the error checking.

13. A multi-bit memory device, comprising:

a plurality of memory cells, each of which is operative to take on more than two data states;

a plurality of sense amplifiers, operatively associated with the plurality of memory cells, that sense data states of the plurality of memory cells and generate data bits therefrom;

a plurality of data latches, respective groups of which store data bits generated by respective ones of the plurality of sense amplifiers such that respective ones of the groups of data latches store respective multi-bit values representing respective data states;

an error detection circuit that receives input data bits and generates respective error indication signals for respective ones of the received input data bits; and a selector circuit that, responsive to a select signal, selectively couples the error detection circuit to one of a first subset of the plurality of data latches corresponding to a first bit position of the stored multi-bit values or a second subset of the plurality of data latches corresponding to a second bit position of the stored multi-bit values to provide input data bits to the error detection circuit.

14. The multi-bit memory device according to claim 13, further comprising an error correction circuit, operatively associated with the plurality of data latches and the error detection circuit, that corrects the stored multi-bit values based on the generated error indication signals.

15. The multi-bit memory device according to claim 14, wherein the selector circuit, responsive to the select signal, selectively couples the error correction circuit and the error detection circuit to one of the first subset of the plurality of data latches or the second subset of the plurality of data latches to provide input data bits to the error detection circuit and to the error correction circuit.

16. The multi-bit memory device according to claim 13, wherein the plurality of memory cells comprises a first plurality of memory cells, wherein the multi-bit memory device further comprises a second plurality of memory cells that store parity information associated with the first plurality of memory cells, and wherein the error detection circuit generates the error indication signals based on the parity information stored in the second plurality of memory cells.

* * * * *